United States Patent [19]

Freitag et al.

[11] Patent Number: 4,547,745

[45] Date of Patent: Oct. 15, 1985

[54] COMPOSITE AMPLIFIER WITH DIVIDER/COMBINER

[75] Inventors: Ronald G. Freitag; James E. Degenford, both of Ellicott City; Daniel C. Boire, Glen Burnie, all of Md.

[73] Assignee: Westinghouse Electric Corp., Pittsburgh, Pa.

[21] Appl. No.: 470,650

[22] Filed: Feb. 28, 1983

[51] Int. Cl.[4] .......................... H03F 3/60; H03F 3/16; H01P 5/12

[52] U.S. Cl. .................................... 330/286; 330/277; 330/54; 333/128

[58] Field of Search ................... 330/53, 54, 277, 286, 330/293; 333/124, 127, 128, 219, 204, 136

[56] References Cited

U.S. PATENT DOCUMENTS 4,234,854 11/1980 Schellenberg et al. ............. 330/286
4,291,279 9/1981 Buck .................................... 330/287

OTHER PUBLICATIONS

Wilkinson, E. J., "An N-Way Hybrid Power Divider", IRE Transaction MTT-8, Jan. 1960.
Hindin, "Gallium Arsenside Analog JC's Rival Discrete Device for Military and Commercial Use", Electronics, Feb. 1982.

Primary Examiner—James B. Mullins
Assistant Examiner—G. Wan
Attorney, Agent, or Firm—W. G. Sutcliff

[57] ABSTRACT

A power combiner has been described incorporating N transmission lines each having a quarter wavelength or multiple thereof for a frequency within a predetermined frequency range where the input of each transmission line has a resistor coupled thereto with the other ends of the resistors coupled together using inductance and capacitance to compensate for the distances between the resistors to provide a floating node which is low impedance in the predetermined frequency range. A composite amplifier is described on gallium arsenide wherein a power divider and power combiner are coupled to a plurality of MESFET's and wherein each input and output of the power combiner and power divider have a resistive load with respect to the MESFET while including a matching circuit and wherein each input of the combiner has a resistor coupled to a first floating node and each output of the divider has a resistor coupled to a second floating node. The invention overcomes the problem of a composite amplifier where many elemental amplifiers must be driven and their output signals combined at frequencies where the physical layout would provide phase differences such as in a layout of parallel cells on a flat surface of a substrate.

16 Claims, 3 Drawing Figures

COMPOSITE AMPLIFIER WITH DIVIDER/COMBINER

GOVERNMENT CONTRACT

The Government has rights in this invention pursuant to Contract No. N00014-81-C-0247 awarded by the Department of the Navy.

BACKGROUND OF THE INVENTION

1. Field of the Invention

This invention relates to a composite amplifier incorporating a power combiner for combining a plurality of microwave signals from a plurality of amplifiers.

2. Description of the Prior Art

In a publication by E. J. Wilkinson, entitled "An N-Way Hybrid Power Divider", published in IRE Transactions (TRANS) MTT-8, January, 1960, pp. 116-118, a power divider is described that provides isolation between output terminals and approximately matched terminal impedances over about a 20% bandwidth. A plurality of quarter wavelength transmission lines are shown in FIG. 3 coupled to an input with the other end of each transmission line having a resistor coupled to a common floating node. A typical embodiment is shown in FIG. 2 wherein the transmission lines are longitudinally parallel and spaced apart from a longitudinal axis with the resistors at the end of the transmission lines radially connected in common at a node on the axis.

An amplifier with a radial line divider/combiner is described in U.S. Pat. No. 4,234,854, which issued on Nov. 18, 1980 to J. M. Schellenberg and M. Cohn and assigned to the assignee herein. In U.S. Pat. No. 4,234,854 a composite amplifier is shown comprising a radial line power divider in which a radial transmission line is divided into a plurality of sectors that are symmetrically disposed on an annular substrate, a plurality of elemental amplifiers are connected to each of the radio line sectors to amplify the power in each sector and a radial line power combiner which has a radial line transmission line divided into a plurality of sectors that are symmetrically disposed on an annular substrate are connected to the elemental amplifiers such that the combiner evenly combines the output of the elemental amplifiers in phase and amplitude to provide a composite amplified output signal.

A Wilkinson combiner/divider for splitting an input signal to two output ports is mentioned on page 120 of a publication by H. J. Hindin, entitled "Gallium Arsenide Analog ICs Rival Discrete Devices for Millitary and Commercial Use". The article is found in ELECTRONICS, Feb. 24, 1982, pp. 117-121.

At the time of the invention the inventors were facing the problem of trying to build a 3-watt, 4-stage 8-12 GHz amplifier. In order to achieve the 3-watt output power goal for the 4-stage amplifier, it was necessary to employ a large gate width, approximately 6400 micrometers field effect transistor in the final amplifier stage. Directly parallelling 32 200 micrometer cells, for example in order to obtain the required 6400 micrometer total gate periphery of the field effect transistor results in extremely low field effect transistor input impedance. Matching an impedance this low (1–2 ohms) to 50 ohms over a broad bandwidth is exceedingly difficult. More importantly, in a field effect transistor this large, phase differences between the cells close to the center feedpoint and those farthest away from the feedpoint cause a significant reduction in field effect transistor gain and power output. This is particularly true at X-band frequencies and above.

Another problem in a 4-stage wide band amplifier is that each amplifier introduces a 6 dB/octave/stage gain roll-off with frequency due to the field effect transistors. For multistage amplifiers in general, a gain equalization circuit for each field effect transistor immediately followed the particular field effect transistor. The first input of the first amplifier is flatly matched across the band, thereby retaining at least to some degree, a good input match advantage of a balanced amplifier. The final three input and last output stage are gain sloped. The equalization network therefore provides a flat drive or constant power drive across a range of frequencies to the next stage. In order to obtain gain equalization or gain slope a portion of the gain achieved by the amplifier stage is deliberately reduced at the lower frequencies.

It is therefore desirable to provide a power combiner for combining a plurality of microwave signals incorporating a modified Wilkinson N-way hybrid power combiner.

It is further desirable to provide a power combiner utilizing a modified N-way hybrid combiner wherein the combiner may be laid out on a substrate as opposed to a coaxial layout.

It is further desirable to provide a composite amplifier incorporating a Wilkinson N-way hybrid power combiner wherein path lengths to a floating node are compensated by adding capacitance.

It is further desirable to provide a composite amplifier incorporating a modified Wilkinson N-way power divider to provide input signals to a plurality of amplifiers and a modified Wilkinson N-way power combiner coupled to the outputs of the plurality of amplifiers to provide a combined output signal.

It is further desirable to provide a composite amplifier incorporating a modified N-way power divider to couple input signals to each of a plurality of amplifiers wherein a coupling network enables low impedance paths to interconnect the resistors at the floating node, thereby enabling layout patterns of spaced apart amplifiers over considerable distances on a substrate.

SUMMARY OF THE INVENTION

In accordance with the present invention, a power combiner is provided comprising a plurality of input terminals adapted for coupling to a plurality of microwave input signals, each input terminal is coupled to one end of a respective transmission line and to one side of a respective resistor, the other end of the transmission lines are coupled together to combine the input signals at an output terminal, and the other end of the resistors are coupled through one or more coupling circuits to the other end of the remaining resistors to provide electrical isolation between the input terminals. The coupling networks allow the resistors to be physically spaced apart while providing low impedance coupling to each other.

The invention further provides a composite amplifier for amplifying signals comprising an input terminal, a plurality of transmission lines having a first end coupled to the input terminal and a second end coupled to the input of a respective amplifier and to a respective resistor, the other side of the resistors are coupled through one or more coupling circuits to each other to provide electrical isolation between the inputs of the amplifiers. A circuit for combining the outputs of the plurality of amplifiers which may include a power combiner described above may be included to provide the output of the composite amplifier.

DESCRIPTION OF THE PREFERRED EMBODIMENTS

Figure 1:
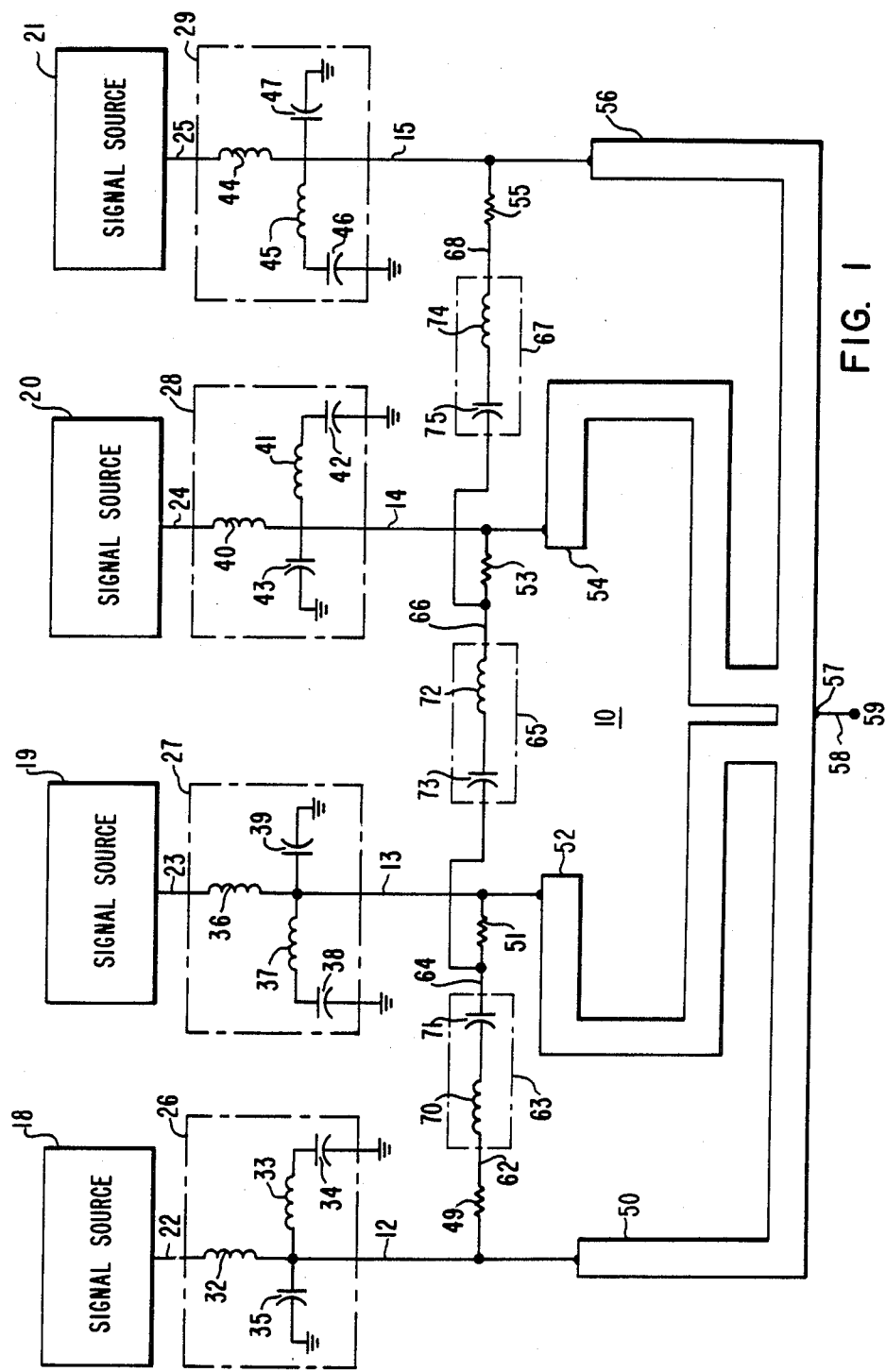
FIG. 1 is one embodiment of the invention.

Referring now to the drawing and in particular to FIG. 1, a power combiner 10 for combining a plurality of microwave input signals on lines 12-15 is shown. Signal sources 18-21 have an output on line 22-25 respectively. Lines 22-25 are coupled through a respective matching network 26-29 to lines 12-15 respectively. Signal sources 18-21 may provide a signal in the frequency range from 8-12 GHz on lines 22-25. Signal sources 18-21 each may be for example the drain of a field effect transistor having a large gate width such as 1600 micrometers. Matching networks 26-29 function to convert the impedance of signal sources 18-21 to a substantially resistive impedance on lines 12-15 which may be for example 17 ohms over a bandwidth from 8-12 GHz.

Matching network 26 includes an inductor 32 which may for example be 0.5 nanohenries coupled between line 22 and line 12. Line 12 is coupled through inductor 33 which may for example be 0.19 nanohenries and through capacitor 34 to ground potential. Capacitor 34 may for example be 10 picofarads. The junction of inductors 32 and 33 at line 12 is also coupled through capacitor 35 to ground potential. Capacitor 35 may for example be 1.75 picofarads. Signal source 18 which may be a field effect transistor having its drain coupled to 8 volts (not shown) and its drain coupled to line 22 and may have an equivalent impedance of 25 ohms between the drain and source terminals with a 0.6 picofarad capacitor coupled between the drain and source terminals.

Matching network 27 has inductor 36 coupled between lines 23 and 13. Inductor 37 is coupled between line 13 and through capacitor 38 to ground potential. Capacitor 39 is coupled between line 13 and ground potential. Matching network 28 comprises inductors 40 and 41 and capacitors 42 and 43. Matching network 29 comprises inductors 44 and 45 and capacitors 46 and 47.

Microwave input signal on line 12 is coupled to one side of resistor 49 and one end of transmission line 50. Microwave input signal on line 13 is coupled to one side of resistor 51 and one end of transmission line 52. Microwave input signal on line 14 is coupled to one side of resistor 53 and one end of transmission line 54. Microwave input signal on line 15 is coupled to one side of resistor 55 and to one end of transmission line 56. The other end of transmission lines 50, 52, 54 and 56 are coupled together at junction 57 and coupled over line 58 to output terminal 59.

Transmission lines 50, 52, 54 and 56 may for example have a length of a quarter wavelength or a multiple $(1+2K)$ quarter wavelength where K is an integer. The quarter wavelength is chosen to be at a frequency within a predetermined frequency range such as from 8-12 GHz. A quarter wavelength transmission line is preferred since a longer $(1+2K)$ $\lambda/4$ transmission line provides more signal loss and function to couple the impedance at the input of the transmission line to the impedance of N times the impedance at junction 57 where N is the number of transmission lines coupled together at junction 57. It is well known in the art that a quarter wave transmission line may match a particular input impedance $Z_S$ to a load impedance $Z_R$, which is pure resistance, by adjusting the characteristic impedance of the transmission line $Z_O$. The relationship is given by Equation 1

$$Z_O = \sqrt{Z_S Z_R} \qquad (1)$$

where $Z_O$ is a characteristic impedance of the transmission line, $Z_S$ is the impedance looking into the line at one end and $Z_R$ is the impedance of the load (pure resistance) at the other end. In FIG. 1, if the impedance looking into transmission line 50 is 17 ohms to match the impedance at line 12, and the resistive load impedance $Z_R$ is 200 ohms at junction 57, then transmission line 50 would have a value of 59 ohms to provide an impedance match of line 12 to junction 57. It is understood that if the load at junction 57 from each transmission line was 200 ohms, then the load or resistance of line 58 would be 50 ohms since the 4 transmission lines are coupled in parallel. Transmission line 50 may be made of microstrip on a substrate having a predetermined thickness and where the line width determines the impedance of the transmission line having a conductor on the lower surface which may be a ground plane.

Isolation between signals on lines 12-15 is obtained by placing resistors 49, 51, 53 and 55 at the junction of each respective transmission line 50, 52, 54 and 56. The isolation resistors permit graceful degradation at the output of power combiner 10 in the event one or more input signals are lost. In addition the power combiner can combine signals which may vary due to variations in the MESFET's arising from fabrication processes. Furthermore, the isolation resistors prevent internal interaction or oscillation within the power combiner or with the input signals. No interaction or oscillation has been observed during tests, etc.

Resistors 49, 51, 53, and 55 have a resistive value equal to or substantially equal to the resistive impedance of line 12 looking towards signal source 18. Resistor 49 is coupled over line 62 through coupling circuit 63 and over line 64 to resistor 51. Resistor 51 is coupled over line 64 through coupling circuit 65 over line 66 to resistor 53. Resistor 53 is coupled over line 66 through coupling circuit 67 and over line 68 to resistor 55. Coupling circuits 63, 65 and 67 function to couple line 62 to lines 64, 66 and 68 with very low impedance in a predetermined frequency range, such as from 8 to 12 GHz. Coupling circuit 63 may for example be a series resonant circuit including inductor 70 and capacitor 71 coupled in series and adjusted in value to be in series resonance at the mid band of a predetermined frequency range. For example, inductor 70 may, for example, be 0.6 nanohenries and capacitor 71 may, for example, be 0.4 picofarads. In likewise manner coupling circuit 65 may include inductor 72 and capacitor 73 coupled in series. Coupling circuit 67 may include inductor 74 and capacitor 75 coupled in series. Inductors 72 and 74 may have the same value as inductor 70 and capacitors 73 and 75 may have the same value as capacitor 71. Inductors 70, 72 and 74 occur in the course of providing a conductive path between resistors 49, 51, 53 and 55. Therefore, capacitor 71 is added between inductor 70 and resistor 51 to compensate or provide a low impedance path at the frequencies of the predetermined frequency range. By using coupling circuits 63, 65 and 67 lines 62, 64, 66 and 68 are coupled together as a floating node to resistors 49, 51, 53 and 55. A floating node of lines 62, 64, 66 and 68 is therefore realized even though the transmission lines are laid out on a flat printed circuitboard or substrate side by side.

Figure 2:
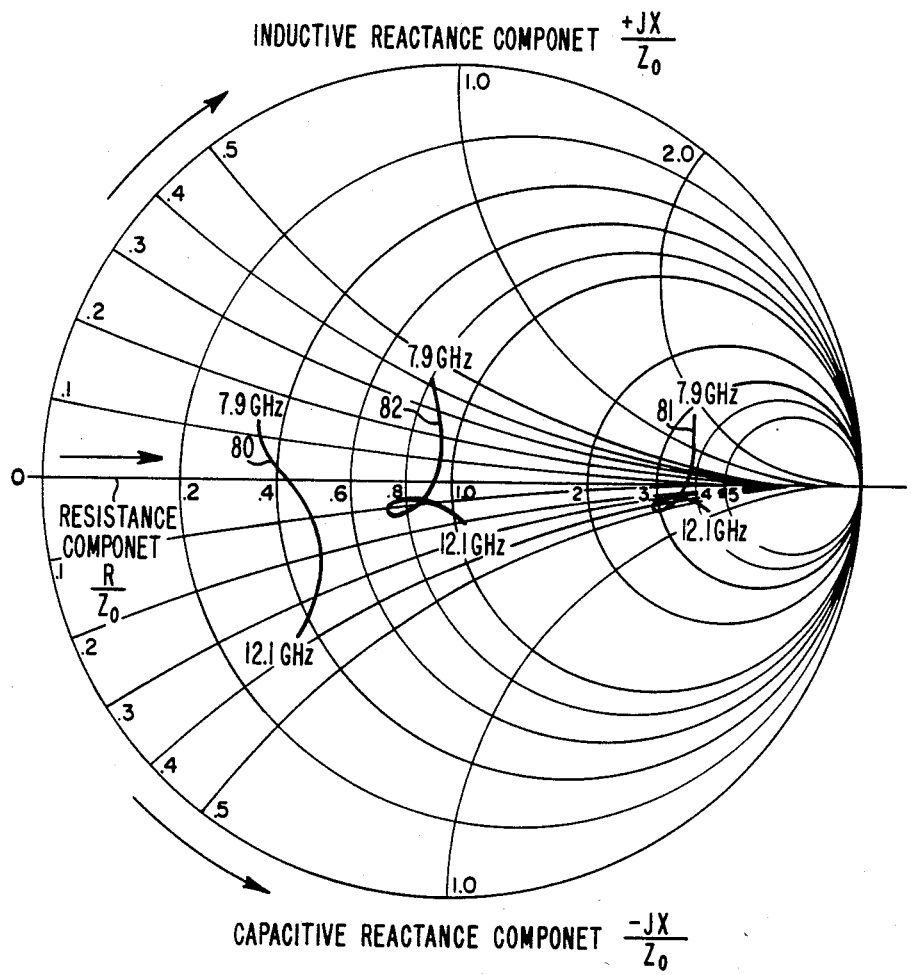
FIG. 2 is a graph showing typical impedance values of the embodiment of FIG. 1.

FIG. 2 is a graph showing the impedance at several circuit points of the embodiment in FIG. 1 over the frequency range from 7.9 to 12.1 GHz. In FIG. 2 a Smith chart well known in the art is shown having curves 80–82 each crossing the abscissa indicative of a pure resistance value with portions on the right top of the ordinate indicative of a resistance plus inductive reactance and portions on the bottom side of the ordinate indicative of a resistance plus capacitive reactance. Referring to FIG. 1 and FIG. 2 line 12 looking into matching network 26 and signal source 18 may have an impedance of approximately 17 ohms as shown by curve 80, over the frequency range from 7.9 to 12.1 GHz. At junction 57 looking into transmission line 50 the impedance is shown by curve 81 which corresponds to a transformation of the impedance by quarter wave transmission line 50. At junction 57 which corresponds to the junction of transmission line 50, 52, 54 and 56 the impedance looking into all four transmission lines is shown by curve 82 in the frequency range from 7.9 to 12.1 GHz. In FIG. 2 the value of the ordinate times $Z_o$, 50 ohms, represents the ordinate value such that curve 80 is generally in the area of 17 ohms, curve 82 is generally in the area of 200 ohms and curve 81 is generally in the area of 50 ohms.

Table I shows values calculated for the isolation between various input signal ports at lines 12, 13, 14 and 15 over the frequency range in discrete steps from 7.9 to 12.1 GHz. In addition, the return loss at the output junction 57 or output terminal 59 is shown over the frequency range from 7.9 to 12.1 GHz in discrete steps. The return loss is expressed as $20 \log |\rho|$ where $\rho$ is the reflection coefficient. The outer circle of the Smith Chart represents $\rho = 1$ or infinite voltage standing wave ratio (VSWR). $\rho$ is expressed in equation 2

$$\rho = \frac{Z_L - Z_o}{Z_L + Z_o} \quad (2)$$

where $Z_L$ is the load impedance and $Z_o$ the impedance of the transmission line etc.

TABLE I

| Frequency (GHz) | Port 1 Return Loss (dB) (Junction 57) | Isolation 3-5 (dB) (line 13 to line 15) | Isolation 2-5 (dB) (line 12 to line 15) | Isolation 2-3 (dB) (line 12 to line 13) |
| --- | --- | --- | --- | --- |
| 7.9  | −11.64 | 22.27 | 14.23 | 16.04 |
| 8.2  | −13.19 | 22.99 | 15.06 | 17.00 |
| 8.5  | −15.22 | 23.74 | 16.03 | 18.31 |
| 8.8  | −18.13 | 24.51 | 17.16 | 20.08 |
| 9.1  | −22.56 | 25.29 | 18.52 | 22.57 |
| 9.4  | −26.88 | 26.11 | 20.20 | 26.41 |
| 9.7  | −22.96 | 26.98 | 22.33 | 33.89 |
| 10.0 | −18.88 | 27.93 | 25.18 | 38.93 |
| 10.3 | −16.46 | 28.92 | 29.28 | 28.26 |
| 10.6 | −15.21 | 29.96 | 36.64 | 23.55 |
| 10.9 | −14.94 | 31.02 | 44.52 | 20.59 |
| 11.2 | −15.74 | 32.07 | 32.61 | 18.44 |
| 11.5 | −18.19 | 33.05 | 27.64 | 16.79 |
| 11.8 | −23.16 | 33.67 | 24.53 | 15.50 |
| 12.1 | −19.29 | 33.44 | 22.40 | 14.59 |

Figure 3:
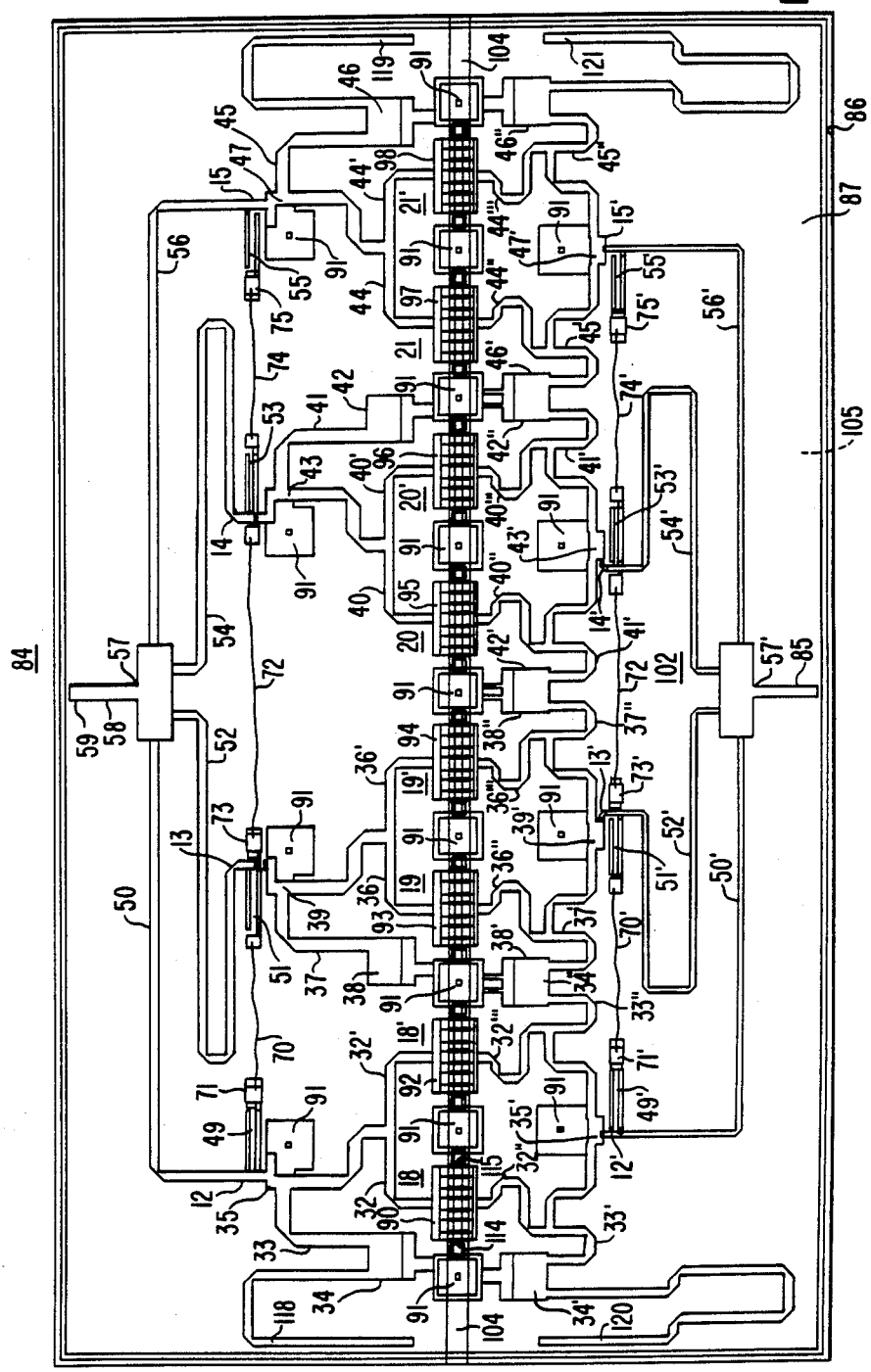
FIG. 3 is an alternate embodiment of the invention.

Referring to FIG. 3 an alternate embodiment of the invention is shown. In FIG. 3 like references are used for functions corresponding to the apparatus of FIG. 1. In FIG. 3 a composite amplifier 84 is shown having an input on line 85 which may for example have a characteristic impedance of 50 ohms and an output on line 59 which may for example have a characteristic impedance of 50 ohms. The entire composite amplifier is fabricated on a substrate 86 having an upper surface 87. Substrate 86 may for example be composed of gallium arsenide having areas activated for fabricating metal semiconductor field effect transistors (MESFET) such as N channel transistors having a gate, source and drain. Signal sources 18–21 and 18'–21' may for example be MESFET devices each having a gate width of 800 micrometers and a gate length of 1 micrometer. MESFET 90 may for example have its drain coupled to inductor 32, its source coupled to ground potential having feed throughs 91 through substrate 86 to a ground electrode on the lower surface of substrate 86. MESFET 92 may have its source coupled to ground potential and its drain coupled to inductor 32'. MESFETS 93 and 94 may have their source electrode coupled to ground potential and its drain coupled to inductors 36 and 36' respectively. MESFETS 95 and 96 may have its source electrode coupled to ground potential and its drain electrode coupled to inductors 40 and 40', respectively. MESFETS 97 and 98 may have its source coupled to ground potential and its drain coupled to inductors 44 and 44', respectively.

The gate electrodes of the MESFET's 90, 92–98 may be supplied from an input signal using a power divider which is very similar to the power combiner operated in the reverse direction. The power divider is shown in the lower half of FIG. 3 having an input 85 coupled to four transmission lines 50', 52', 54' amd 56' which are coupled together at junction 57'. Like references, including those primed, are used for functions corresponding to the power combiner shown in FIG. 1 to represent the power divider 102 shown in FIG. 3. At the end of transmission lines 50', 52', 54' and 56' are resistors 49', 51', 53' and 55' respectively which function to provide electrical isolation between the outputs of power divider 102, lines 12'–15'. Between line 12' and MESFET 90 is a matching network such that the impedance at line 12 looking into or towards MESFET 90 would appear resistive. The same applies to the matching networks between MESFET's 92–98 and lines 12–15. Thus the input at line 85 appears purely resistive.

The length of the conductors in the matching network provide inductance and the square capacitances are thin film metallization overlaying a second metallization which is grounded with a dielectric therebetween. As can be seen in FIG. 3 the layout is symmetrical in length to provide equal inductances and time delay to each MESFET.

In fabrication of the monolithic composite amplifier, a substrate of gallium arsenide may be used having conductors fabricated with chrome and gold. The resistors 49, 51, 53 and 55 as well as 49', 51', 53' and 55' are formed by ion implantation. The MESFET's 90, 92-98 are formed in an active region strip 104 which runs across the center of the substrate to provide the active area for the channel of the MESFET's. Each MESFET may for example be a cell cluster comprising four 200 micrometer channel width transistors coupled in parallel having a common source, gate and drain. The size of the cell cluster forming the MESFET 90 is chosen to get low or acceptable source to ground inductance to obtain predetermined gain at predetermined frequencies. In FIG. 3, MESFET 90 has its source electrode coupled to ground on either side 114 and 115 of the cell cluster to gold metalization which is in close proximity to feed throughs 91. Larger cell clusters would provide ground connections to the source electrode at either side of the cell cluster which would be further apart thus raising the inductance of the source electrode to the internal source electrode within the cell cluster at the center 116 of the cell cluster of MESFET 90. A metallization not shown on the lower surface 105 of substrate 86 provides a ground plane so that the conductive strips on upper surface 87 are microstrip lines having an impedance depending on the thickness of the gallium arsenide substrate 86 which may be for example 100 micrometers and the width of the conductors on upper surface 87.

By using power divider 102, electrical isolation is provided by resistors 49', 51', 53' and 54' coupled to a floating node which consists of capacitors 71', 73' and 75' along with inductors 70, 72 and 74, formed by gold-wire bonds above upper surface 87 and attached at bonding pads.

While the embodiment in FIG. 3 shows a divider for dividing an input signal into four signals with isolation between the outputs of the divider, N number of transmission lines may be used to provide N outputs wherein N is an integer which may be even or odd. As more transmission lines are added, of course, the impedance at junction 57' would presumably be lower since the impedance would be the combined impedance of each of the N transmission lines at junction 57, which if they were all of the same impedance would be the impedance of one transmission line divided by N.

In FIG. 3 junction 57 and 57' may be a capacitor comprised of a bottom layer of metal, a layer of dielectric and a top layer of metal coupled directly to line 58 or 85. The capacitor at junction 57 and 57' function to block direct current or bias current while passing signals in the predetermined frequency range.

In FIG. 3 a voltage source of +8 volts may be applied to lines 118 and 119 on either side of substrate 86. Lines 118 and 119 are coupled to one side of capacitors 34 and 46 respectively in ohmic contact to one end of inductors 33 and 45 respectively.

In FIG. 3 a bias voltage in the range from −2 to −3 volts may be applied to lines 120 and 121 on either side of substrate 86. Lines 120 and 121 are coupled to one side of capacitors 34' and 46' respectively in ohmic contact to one end of inductors 33' and 45'' respectively.

Likewise, the power combiner shown in FIG. 3 is not limited to four transmission lines but may be any number N where N is an integer which may be odd or even. It is understood that each transmission line input would have a resistor coupled to a floating node to provide isolation between inputs.

The invention provides a power combiner and power divider which may be laid out on a relatively flat surface. The quarter wavelength transmission lines or a transmission line having a multiple quarter wavelength permits the circuitry to be distributed or spaced apart while maintaining equal phase at each input or output. The floating node is coupled through a resistor to each input or output to provide electrical isolation at each input or output. The floating node is enhanced or realized by adding capacitance to cancel out the inductance of the conductor lengths connecting the resistors to the floating node such that in the frequency range of operation the inductance and capacitance are series resonant and/or of very low impedance even though the resistors are spaced apart on a substrate.

A power combiner has been described for coupling a plurality of input signals together utilizing a plurality of transmission lines of a predetermined impedance, each coupled to a respective input and joined together at the other end in common to provide an output signal. The impedance of the transmission line is adjusted to match the impedance of the input signal to the impedance looking into the transmission line at the output. The transmission line is adjusted to be a quarter wavelength or a multiple (1+2K) thereof where K is an integer at the midband of a frequency range. Isolation resistors are also coupled to each input and the other end of the resistors are coupled together over a low impedance path by providing resonant (inductive and capacitive) coupling networks which permit low impedance coupling between spaced apart resistors.

A power divider is also shown having a plurality of outputs for dividing an input signal and distributing the input signal to a plurality of outputs through a transmission line each having approximately a quarter wavelength or multiple (1+2K) thereof where K is an integer of a frequency in a predetermined frequency range and wherein the impedance at the input looking into one of the transmission lines matches the impedance at the output of the transmission line that the transmission line is coupled to. Resistors are attached to the output of each transmission line with the other end coupled together to provide a floating node which provides electrical isolation between outputs. Conductive paths between resistors to form the floating node may have its inductance compensated with capacitance to provide series resonant coupling circuits such that the floating node will have a low impedance path to each resistor.

By utilizing a power combiner and power divider in conjunction with gallium arsenide MESFET's a monolithic composite amplifier may be fabricated using a gallium arsenide substrate having regions activated for the fabrication of the MESFET's with conductive paths and transmission lines formed by chrome followed by gold metallization and resistors formed by ion implantation in regions where the substrate is non-conducting. Gold wires bonded between points on the substrate may provide conductive paths between resistors and crossovers. Thin film capacitors formed on the upper surface of the substrate may provide capacitance for matching with conductor strips to provide matching circuits to and from the MESFET's to provide terminals with substantially resistive impedance over a predetermined frequency range.

A three watt amplifier has been described having cluster cells of MESFET's, having a gate length of one micron or less, and a gate width of 800 micrometers. Two MESFET clusters are coupled together to form a 1600 micrometer gate width which has matching circuits or tuning circuits for coupling the gate to an output of a power divider and the drain to an input of a power combiner. Three other similar structures, a pair of MESFET's with matching circuits, are coupled to respective outputs of a power divider and respective inputs of a power combiner to utilize a four output power divider and four input power combiner to form a composite amplifier having MESFET's with a total of 6400 micrometer gate width on gallium arsenide.

We claim:

1. A power combiner for combining a plurality of microwave input signals comprising:
    a plurality of input terminals adapted for coupling to said microwave input signals,
    each said input terminal coupled to a first end of a respective transmission line and to a first end of a respective resistor,
    the second ends of said transmission lines coupled together to combine the input signals at an output terminal,
    each second end of said resistors coupled through one or more coupling circuits to said second end of said remaining resistors to provide electrical isolation between said input terminals.

2. The power combiner of claim 1 further including a matching network coupled to each input terminal and adapted for coupling to said microwave input signal to transform the input impedance of the input signal source to a substantially resistive impedance of a predetermined value.

3. The power combiner of claim 1 wherein each transmission line electrically matches the impedance at the input terminal to N times the impedance of the output terminal where N is the number of transmission lines.

4. The power combiner of claim 1 wherein each transmission line has a length of Nλ/4 where N is an odd integer and λ is a wavelength within a predetermined microwave frequency range.

5. The power combiner of claim 1 wherein said resistors have a common value.

6. The power combiner of claim 1 wherein said resistors have a first predetermined value substantially equal to the resistive impedance of said input signals coupled to said input terminals.

7. The power combiner of claim 1 wherein said transmission lines are formed by first conductors on the upper surface of a substrate having a second conductor on the lower surface of said substrate beneath said first conductor to form microstrip transmission lines.

8. The power combiner of claim 1 wherein said coupling circuits have substantially zero impedance at a frequency within a predetermined microwave frequency range.

9. The power combiner of claim 1 wherein said second ends of said resistors are spaced apart and wherein said coupling circuit includes capacitance to compensate for the inductance arising from the conductor length to traverse the distance from one of said spaced apart second ends of said resistors to another at a frequency within a predetermined microwave frequency range.

10. The power combiner of claim 9 wherein said second ends of said resistors are spaced apart on a substrate.

11. The power combiner of claim 1 further including a plurality of field effect transistors each having a gate, source and drain electrode, each said gate of said field effect transistors adapted for coupling to a respective microwave input signal, each said drain of said field effect transistors coupled through a matching network to a respective input terminal, each said matching network adjusted to convert the impedance of the drain of said respective field effect transistor to a substantially resistive impedance of a predetermined value.

12. A composite amplifier for amplifying signals comprising,
    an input terminal,
    a plurality of first transmission lines having a first end coupled to said input terminal and a second end coupled to the input of a respective elemental amplifier and to a first end of a respective first resistor,
    each second end of said first resistors coupled through one or more first coupling circuits to said second end of said remaining resistors to provide electrical isolation between said inputs of said elemental amplifiers, and
    means for combining the outputs of said plurality of elemental amplifiers.

13. The composite amplifier of claim 12 wherein said means for combining includes:
    each said output terminal of said elemental amplifier coupled to a first end of a respective second transmission line and to a first end of a respective second resistor,
    the second end of said second transmission lines coupled together to combine the output signals of said elemental amplifiers at an output terminal,
    each second end of said second resistors coupled through one or more second coupling circuits to said second end of said remaining second resistors to provide electrical isolation between said output terminals of said elemental amplifiers.

14. The composite amplifier of claim 12 wherein each said elemental amplifier includes an input matching network to provide a resistive input of a predetermined value.

15. The composite amplifier of claim 12 wherein said second ends of said first resistors are spaced apart and wherein said first coupling circuit includes capacitance to compensate for the inductance arising from the conductor length to traverse the distance from one of said spaced apart second ends of said first resistors to another at a frequency within a predetermined microwave frequency range.

16. The composite amplifier of claim 15 wherein said composite amplifier is fabricated on a substrate.

* * * * *